United States Patent [19]
McCulloch et al.

[11] Patent Number: 5,998,092
[45] Date of Patent: Dec. 7, 1999

[54] WATER SOLUBLE NEGATIVE-WORKING PHOTORESIST COMPOSITION

[75] Inventors: Iain McCulloch, Basking Ridge; Anthony J. East, Madison; Ming Kang, Colonia, all of N.J.; Richard Keosian, Nazareth, Pa.; Hyun-Nam Yoon, New Providence, N.J.

[73] Assignee: Clariant International, Ltd., Switzerland

[21] Appl. No.: 09/085,880

[22] Filed: May 27, 1998

[51] Int. Cl.⁶ .............................. G03F 7/032; C08F 24/00
[52] U.S. Cl. ......................................... 430/270.1; 526/270
[58] Field of Search ........................ 526/270; 430/270.1

[56] References Cited

U.S. PATENT DOCUMENTS

| | | | |
|---|---|---|---|
| 4,806,448 | 2/1989 | Roth | 430/270 |
| 5,059,698 | 10/1991 | Schulthess et al. | 549/375 |
| 5,585,223 | 12/1996 | Fréchet et al. | 430/296 |
| 5,723,258 | 3/1998 | Kim et al. | 430/270.1 |

*Primary Examiner*—Janet Baxter
*Assistant Examiner*—Rosemary Ashton
*Attorney, Agent, or Firm*—Sangya Jain

[57] ABSTRACT

A water soluble polymer that when used with a suitable photoacid generator (PAG) forms a negative working water soluble photoresist. The polymer comprises of a backbone, such as polyvinyl ether, coupled by a linkage group to an acetal protected β-keto acid group. With the addition of a number of commercially available photo acid generators, the polymer formulation forms a negative working photoresist that is water soluble. Exposure to radiation will cause a photoacid catalyzed deprotection of the acetal group, yielding a β-keto acid which, upon heating, will undergo decarboxylation, which results in a water insoluble photoproduct and evolution of $CO_2$ as a byproduct. This photochemically induced reaction results in a significant change in the polymer solubility parameter, and the product is no longer soluble in water. As this solubility change does not require crosslinking, there will be no swelling of the resist images on exposure to the aqueous base during development, and hence no loss of resolution. This enables the photoresist to be used at fine resolutions at i-line and deep UV wavelengths.

6 Claims, No Drawings

WATER SOLUBLE NEGATIVE-WORKING PHOTORESIST COMPOSITION

BACKGROUND OF THE INVENTION

The present invention is directed to water soluble polymers that when used with a photoacid generator (PAG), form a negative working water soluble photoresist.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then heated to evaporate any solvent in the photoresist composition and to fix the coating onto the substrate. The coated surface of the substrate is next masked and subjected to exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this masked exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed to radiation, the areas of the resist composition exposed to the radiation become less soluble to a developer solution while the unexposed areas of the photoresist coating remain soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed to radiation, those areas of the photoresist composition exposed to the radiation become more soluble to the developer solution while those areas not exposed remain insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After development, the now partially unprotected substrate may be treated with a substrate-etchant solution or plasma gas and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Photoresist resolution is defined as the smallest feature which the resist composition can transfer from the photomask to the substrate with a high degree of image edge acuity after exposure and development. In most manufacturing applications today, resist resolution on the order of less than one micron is necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

Previously, positive working photoresists were preferred over negative working photoresists as they generally exhibit superior resolution capabilities. This is often caused by the swelling of negative images during development. The present invention eliminates this swelling, as the polymer undergoes a photochemically induced elimination reaction rather than crosslinking, to change solubility. During this reaction, a polarity switch occurs, and the resultant product has a different solubility parameter. As a result, the product has no affinity with the solvent from which it was cast. Therefore, in a water-cast photoresist, the resist images, during development, will not have an affinity with the aqueous developer, and hence will not swell.

SUMMARY OF THE INVENTION

The present invention is directed to water soluble polymers that when used with a suitable photoacid generator (PAG) form a negative working water soluble photoresist. Upon exposure to radiation the polymer does not become crosslinked, but changes solubility parameter, and thus does not swell on development, which allows improved resolution. This enables the photoresist to be used at fine resolutions at i-line and deep UV wavelengths. Further since the solvent used with the present photoresist is water, the use of this photoresist in semiconductor manufacturing will be environmentally friendly. The polymer is comprised of a backbone, such as polyvinyl ether, coupled by a linkage group to an acetal protected β-keto acid group. The choice of backbone and any comonomer, is influenced by its solubility in water, as the initial polymer must be sufficiently soluble in water to provide a suitable formulation viscosity. With the addition of a number of commercially available photo acid generators, the polymer formulation forms a negative working photoresist that is water soluble. Exposure to radiation will cause a photoacid catalyzed deprotection of the acetal group, yielding a β-keto acid which, upon heating, will undergo decarboxylation, which results in a water insoluble photoproduct. As the starting polymer is water soluble, the polarity switch will create a negative image when developed from an aqueous base.

DESCRIPTION OF THE PREFERED EMBODIMENTS

The present invention is directed to a polymer particularly suitable for use as a photoresist. The polymer is comprised of a backbone coupled by a linkage group to an acetal protected β-keto acid group (2-substituted, 3,3-ethylenedioxy-butanoic acid). With the addition of a number of commercially available photo acid generators and water, the polymer formulation forms a water soluble negative working photoresist. Exposure to radiation will cause a photoacid catalyzed deprotection of the acetal group, yielding a β-keto acid which will undergo decarboxylation upon heating, which results in a water insoluble photoproduct.

The polymer is of the structure:

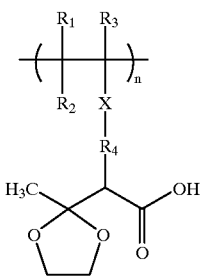

where $R_1$–$R_4$ are independently H, ($C_1$–$C_5$) alkyl or ($C_1$–$C_5$) alkoxy, X is C=O, OCO, CONH, O, aryl ($C_1$–$C_5$) alkyl, The polymers of the present invention are generally in the form of a water soluble powder. A photoresist formulation however, is a liquid solution comprising of the polymer, a PAG and water as solvent. Generally a solution useful as a photoresist will contain 1–30% by weight of polymer powder, a photoacid generator in an amount effective to cause cleavage of the active group of the polymer upon exposure to radiation, with the remainder being water. Photoacid generators useable with the polymers of the present invention are commercially available. All that is required is that, upon exposure to radiation of the appropriate wavelength, the photoacid generator generates sufficient acid to cause cleavage of the acetal moiety. Suitable photoacid generators include onium salts, hydroxymaleimide trifilates and diazonium sulfonates. Different photoacid generators are activated by different wavelengths of light, thus the selection of a photoacid generator may be based on the resolution requirements of the microlithography. The resolution and sensitivity of the photoacid generators can be altered by various processes. For example, onium salts can also be sensitized with anthracenes for use in i-line microlithography processes. A listing of other photoacid generators is found at column 3 of U.S. Pat. No. 5,585,223 the disclosure of which is hereby incorporated by reference as if fully set forth herein.

The prepared photoresist composition solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group IIIN compounds.

The photoresist coatings of the present invention are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoting layer of a suitable composition, such as one containing hexa-alkyl disilazane.

The photoresist composition solution is then coated onto the substrate, and the substrate is treated or "soft baked" at a temperature from about 70° C. to about 200° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. The treatment is conducted until the rate of change of solvent removal becomes relatively insignificant. The temperature and time selection of the soft bake depends on the photoresist properties desired by the user, as well as the equipment used and commercially desired coating times.

The coated substrate can then be exposed to actinic radiation, e.g., ultraviolet radiation, at a wavelength of from about 200 nm to about 450 nm, x-ray, electron beam, ion beam or laser radiation, in any desired pattern, produced by use of suitable masks, negatives, stencils, templates, etc. Exposure to radiation will activate the photoacid generator and cause a photoacid catalyzed deprotection of the acetal group of the 2-substituted 3,3-ethylenedioxy-butanoic acid, yielding a β-keto acid which will undergo decarboxylation upon heating, which results in a water insoluble photoproduct and evolution of $CO_2$. The photoresist is then subjected to a post exposure second baking or heat treatment either before or after development. The second heat treatment will drive off additional $CO_2$.

The exposed photoresist-coated substrates are developed to remove the image-wise exposed areas by immersion in an aqueous alkaline developing solution or developed by spray development process. The solution is preferably agitated, for example, by nitrogen burst agitation. The substrates are allowed to remain in the developer until all, or substantially all, of the photoresist coating has dissolved from the non exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances.

Photoresists of the present invention may also contain other optional ingredients such as colorants, dyes, anti-striation agents, sensitizers, leveling agents, plasticizers, adhesion promoters, speed enhancers, solvents and such surfactants as non-ionic surfactants may be added to the solution of the polymer resin, sensitizer and solvent before the photoresist composition is coated onto a substrate.

The solvents may be present in the overall composition in an amount of up to 95% by weight of the solids in the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to about 10% weight levels, based on the combined weight of film forming resin and sensitizer.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

In the examples to follow, examples 1 through 4 show the formation of a functionalized styrene polymer containing an acetal protected β-keto acid group which with the addition of a photoacid generator, will form a negative working water soluble photoresist. Examples 5–8 are directed to a functionalized vinyl polymer containing an acetal protected β-keto acid group and example 9 shows a copolymer of the functionalized vinyl monomer, with styrene.

EXAMPLE 1

Preparation of ethyl 2-(4-vinylbenzyl)-3-oxobutanoate

Ethyl acetoacetate (27.61 g, 0.21 mol) was dissolved in ethanol (100 ml) which was cooled in an ice-water bath, and sodium ethoxide (15.59 g, 0.22 mol) was added. 4-Vinylbenzyl chloride (33.92 g, 0.2 mole) was added. The mixture was refluxed for 16 hours, then the resulting slurry was filtered to remove any salt, and the solution collected. The solvent was removed under reduced pressure to give ethyl 2-(4-vinylbenzyl)-3-oxobutanoate in the form of a light red liquid (49 g) in 95% yield.

$^1$H NMR (200 MHz, CDCl$_3$, δ ppm): 7.30 and 7.10 (m, 4H, aromatic), 6.60 (m, 1H, H$_2$C=CH—), 5.70 and 5.15 (d, 2H, =CH$_{cis}$H$_{trans}$), 4.45 (d, 2H, —CH$_2$-aromatic), 4.10 (q, 2H, —OCH$_2$CH$_3$), 3.10 [t, 1H, —COCH(R)CO$_2$—], 2.15 (s, 3H, CH$_3$CO—), 1.15 (t, 3H, —OCH$_2$CH$_3$). $^{13}$C NMR (200 MHz, CDCl$_3$, δ ppm): 202 (—CO$_2$—), 169 (—CO—), 138 (=CH$_2$), 136 (H$_2$C=CH—), 135, 129, 126 and 113 (aromatic), 61 [—COCH(R)CO$_2$—], 50 (—OCH$_2$CH$_3$), 34 (—CH$_2$—), 29 (CH$_3$CO—), 14 (—OCH$_2$CH$_3$).

EXAMPLE 2

Preparation of ethyl 2-(4-vinylbenzyl)-3,3-(ethylenedioxy)butanoate

A mixture of ethyl 2-(4-vinylbenzyl)-3-oxobutanoate (24.63 g, 0.1 mol) (formed in Example 1), ethylene glycol (12.54 g, 0.2 mol), and p-toluenesulfonic acid (250 mg) in benzene (100 ml) was refluxed for 72 h (Dean-Stark water separator, 1.9 ml of water). The solution was cooled and washed with aqueous sodium bicarbonate (5%, 2×100 ml), water (100 ml) and brine (150 ml). The organic layer was dried (MgSO$_4$), filtered, and solvent removed under reduced pressure to give an orange liquid (27.7 g) in 81% yield. The residue was distilled under reduced pressure to furnish pure colorless liquid product of ethyl 2-(4-vinylbenzyl)-3,3-(ethylenedioxy)butanoate (22 g, 64%); bp 121° C. (22 mmHg).

$^1$H NMR (200 MHz, CDCl$_3$, δ ppm): 7.35 and 7.15 (m, 4H, aromatic), 6.70 (m, 1H, H$_2$C=CH—), 5.75 and 5.20 (d, 2H, =CH$_{cis}$H$_{trans}$), 4.55 (d, 2H, —CH$_2$-aromatic), 4.05 (q, 2H, —OCH$_2$CH$_3$), 4.0 (m, 4H, 2×—OCH$_2$—), 3.05 [t, 1H, —COCH(R)CO$_2$—], 1.55 (s, 3H, CH$_3$C—), 1.10 (t, 3H, —OCH$_2$CH$_3$). $^{13}$C NMR (200 MHz, CDCl$_3$, δ ppm): 202 (—CO$_2$—), 171 (—CO—), 139 (=CH$_2$), 136 (H$_2$C=CH—), 135, 129, 126 and 113 (aromatic), 109 [—O(R)C(R)O—], 65 (—OCH$_2$CH$_2$O—), 60 (—OCH$_2$CH$_3$), 56 [—COCH(R)CO$_2$—], 34 (—CH$_2$—), 22 (CH$_3$C—), 14 (—OCH$_2$CH$_3$).

EXAMPLE 3

Preparation of ethyl 2-(4-vinylbenzyl)-3,3-(ethylenedioxy)butanoate polymer

Ethyl 2-(4-vinylbenzyl)-3,3-(ethylenedioxy)butanoate (14.52 g, 0.05 mol) (formed in Example 2) was dissolved in DMF (75 ml). The mixture was heated to 65 ° C. while stirring. and degassed by vigorously bubbling argon, via an inlet needle in sealed rubber septum, through the solution for 0.5 hour. An aliquot of a solution of AIBN (0.0838 g, 0.5 mmol, 1 mol % total monomer) in DMF (0.9 ml) was injected and degassed for 0.25 hour. Both inlet and outlet needles were removed and the sealed vessel allowed to stir at 65 ° C. for 24 hours. The resulting mixture was precipitated into 1600 ml of 2-propanol, then filtered to give an off-white powder product. The product was purified by dissolving in ethyl acetate and reprecipitating to 2-propanol. The solid ethyl 2-(4-vinylbenzyl)-3,3-(ethylenedioxy)-butanoate polymer was dried in the air to give 10 g white solid.

$^1$H NMR (200 MHz, CDCl$_3$+TMS, δ ppm): 6.20~7.10 (4H, aromatic), 3.90~4.20 (6H, —OCH$_2$CH$_3$ and 2×—OCH$_2$—), 3.40~3.60 [1H, —COCH(R)CO$_2$—], 2.80~3.00 (2H, —CH$_2$-aromatic), 2.00~2.20 (—CH—, backbone). 1.00~1.70 (—CH$_2$—, backbone), 1.00 (3H, CH$_3$C—), 0.80 (3H, —OCH$_2$CH$_3$). $^{13}$C NMR (200 MHz, CDCl$_3$+TMS, δ ppm): 172 (—CO2—), 142~146 (1C, aromatic), 135~137 (1C, aromatic), 126~130 (4C, aromatic), 110 [—O(R)C(R)O—], 65 (—OCH$_2$CH$_2$O—), 61 (—OCH$_2$CH$_3$), 56 [—COCH(R)CO$_2$—], 44~47(—CH$_2$—, backbone), 40~42 (—CH—, backbone), 34 (—CH$_2$-aromatic), 22 (CH$_3$C—), 14 (—OCH$_2$CH$_3$).

EXAMPLE 4

Preparation of ethyl 2-(4-vinylbenzyl)-3,3-(ethylenedioxy)butanoic acid polymer

Ethyl 2-(4-vinylbenzyl)-3,3-(ethylenedioxy)butanoate polymer (formed in Example 3) (1.9 g, 7.7 mmol) was dissolved in g-butyrolactone (30 ml). A solution of NH$_4$OH (30% in water) was added and the solution warmed to 110 ° C. for 5 hours. The resultant solution was made slightly acidic with the addition of HCl and the ethyl 2-(4-vinylbenzyl)-3,3-(ethylenedioxy)butanoic acid polymer precipitated into toluene and dried as a white powder (0.6g).

$^1$H NMR (200 MHz, CDCl$_3$, δ ppm): 6.20~7.10 (4H, aromatic), 4.00~4.20 (2H, —OCH$_2$CH$_3$), 3.60~3.80 [1H, —COCH(R)CO$_2$—], 2.90~3.10 (2H, —CH$_2$-aromatic), 1.90~2.20 (—CH—, backbone). 1.00~1.70 (—CH$_2$—, backbone), 1.25 (3H, CH$_3$C—), 1.20 (3H, —OCH$_2$CH$_3$). $^{13}$C NMR (200 MHz, CDCl$_3$, δ ppm): 202 (—CO$_2$—), 169 (—CO—), 143~146 (1C, aromatic), 135~136 (1C, aromatic), 126~130 (4C, aromatic), 62 [—COCH(R)CO$_2$—], 61 (—OCH$_2$CH$_3$), 42~46(—CH$_2$—, backbone), 40~42 (—CH—, backbone), 34 (—CH$_2$-aromatic), 29 (CH$_3$C—), 14 (—OCH$_2$CH$_3$).

EXAMPLE 5

Preparation of ethyl 2-acetyl-5-hexenoate

Ethyl acetoacetate (6.57 g, 0.05 mol) was dissolved in ethanol (25 ml) and sodium ethoxide (3.9 g, 0.55 mol) was added. The solution was cooled to room temperature and 4-bromo-1-butene (6.96 g, 0.05 mole) was added. The mixture was refluxed for 5 hours. The resulting solution was filtered, ethyl acetate was added (75 ml), and washed with a solution of hydrochloric acid (2×200 ml, 5N) and brine (100 ml). The organic layer was dried (MgSO$_4$), filtered, and solvent removed under reduced pressure to give ethyl 2-acetyl-5-hexenoate in the form of a light yellow liquid (9.29 g) in 91% yield.

$^1$H NMR (200 MHz, CDCl$_3$, δ ppm): 5.75 (m, 1H, H$_2$C=CH—), 5.00 (m, 2H, =CH$_{cis}$H$_{trans}$), 4.15 (q, 2H, —OCH$_2$CH$_3$), 3.40 [t, 1H, —COCH(R)CO$_2$—], 2.10 (s, 3H, CH$_3$CO—), 1.80~2.10 (m, 4H, —CH$_2$CH$_2$—),1.20 (t, 3H, —OCH$_2$CH$_3$). $^{13}$C NMR (200 MHz, CDCl$_3$, δ ppm): 202 (—CO$_2$—), 170 (—CO—), 137 (H$_2$C=CHO—), 115 (=CH$_2$), 61 (—OCH$_2$—), 59 (—CH—), 31 (=CH—CH$_2$—), 29 (CH$_3$—), 27 (=CHCH$_2$CH$_2$—), 14 (—OCH$_2$CH$_3$).

EXAMPLE 6

Preparation of ethyl 2-(3-butenyl)-3,3-(ethylenedioxy)butanoate

A mixture of ethyl 2-acetyl-5-hexenoate (30.62 g, 0.15 mol) (formed in Example 5), ethylene glycol (18.82 g, 0.3 mol), and p-toluenesulfonic acid (250 mg) in benzene (150 ml) was refluxed for 48 h (Dean-Stark water separator, 2.3 ml of water). The solution was cooled and washed with aqueous sodium bicarbonate (5%, 2×100 ml), water (100 ml) and brine (150 ml). The organic layer was dried (MgSO$_4$), filtered, and solvent removed under reduced pressure to give an orange liquid (27.7 g) in 81% yield. The residue was distilled under reduced pressure to furnish pure colorless liquid product of ethyl 2-(3-butenyl)-3,3-(ethylenedioxy)butanoate (22 g, 64%); bp 121° C. (22 mmHg). $^1$H NMR (200 MHz, CDCl$_3$, δ ppm): 5.75 (m, 1H, H$_2$C=CH—), 5.00 (m, 2H, =CH$_{cis}$H$_{trans}$), 4.15 (q, 2H, —OCH$_2$CH$_3$), 3.95 (m, 4H, 2×—OCH$_2$—), 2.60 [dd, 1 H, —CCH(R)CO$_2$— ], 1.60~2.10 (m, 4H, —CH$_2$CH$_2$—), 1.40 (s, 3H, CH$_3$—), 1.20 (t, 3H, —OCH$_2$CH$_3$). $^{13}$C NMR (200 MHz, CDCl$_3$,δ ppm): 172 (—CO2—), 137 (H$_2$C=CHO—), 115 (=CH$_2$), 109 [—O(R)C(R)O—], 64 (—OCH$_2$CH$_2$O—), 60 (—OCH$_2$CH$_3$), 53 (—CH—), 32 (=CH—CH$_2$—), 27 (=CHCH$_2$CH$_2$—), 21 (CH$_3$—), 14 (—OCH$_2$CH$_3$).

EXAMPLE 7

Preparation of ethyl 2-(3-butenyl)-3,3-(ethylenedioxy)butanoic acid

A mixture of ethyl 2-(3-butenyl)-3-(ethylenedioxy) butanoate (6.85 g, 0.03 mol), formed in Example 6, and aqueous potassium hydroxide (50 ml, 1.1 M) was refluxed for 22 h. The cooled mixture was then extracted with ether (100 ml). The aqueous layer (pH=13) was acidified in an ice-water bath with hydrochloric acid (100 ml, 1M, pH=1) and extracted with ether (2×100 ml). The solvent was removed under reduced pressure to give ethyl 2-(3-butenyl)-3,3-(ethylenedioxy)butanoic acid in the form of a viscous light yellow liquid (5.29 g) in 88% yield. $^1$H NMR (200 MHz, CDCl$_3$, δ ppm): 5.70 (m, 1H, H$_2$C=CH—), 4.95 (m, 2H, =CH$_{cis}$H$_{trans}$), 3.95 (m, 4H, 2×—OCH$_2$—), 2.6 [dd, 1H, —CCH(R)CO$_2$—], 1.60~2.10 (m, 4H, —CH$_2$CH$_2$—), 1.35 (s, 3H, CH$_3$—), $^{13}$C NMR (200 MHz, CDCl$_3$, δ ppm): 178 (—CO$_2$—), 137 (H$_2$C=CHO—), 115 (=CH$_2$), 109 [—O(R)C(R)O—], 65 (—OCH$_2$CH$_2$O—), 53 (—CH—), 32 (=CH—CH$_2$—), 27 (=CHCH$_2$CH$_2$—), 21 (CH$_3$—).

EXAMPLE 8

Preparation of ethyl 2-(3-butenyl)-3,3-(ethylenedioxy)butanoic acid polymer

Ethyl 2-(3-butenyl)-3,3-(ethylenedioxy)butanoic acid (4.7 g, 0.023 mol) as formed in Example 7 was added to a mixture of lithium aluminum tetradecyl (22.2 ml), titanium tetrachloride in cyclohexane (4 ml) and 40 ml of cyclohexane. The solution was stirred for 22 hours. A light gray suspension formed, then MeOH was added to dissolved the solid, and the resultant solution precipitated in EtOAc to give an off white solid ethyl 2-(3-butenyl)-3,3-(ethylenedioxy)butanoic acid polymer.

EXAMPLE 9

Preparation of ethyl 2-(3-butenyl)-3,3-(ethylenedioxy)butanoic acid and styrene copolymer A mixture of ethyl 2-(3-butenyl)-3,3-(ethylenedioxy) butanoic acid (formed in Example 7) (9.18 g, 0.051 mol) and styrene (7.59 g, 0.05 mol) were dissolved in g-butyrolactone (100 ml). The mixture was heated to 65 ° C. while stirring. and degassed by vigorously bubbling argon, via an inlet needle in sealed rubber septum, through the solution for 0.5 hour. An aliquot of a solution of AIBN (0.1314 g , 0.8 mmol, 1 mol % total monomer) in g butyrolactone (2.8 ml) was injected and degassed 0.5 hour. In total, 2 aliquots were added at intervals of 5 hours. Both inlet and outlet needles were removed and the sealed vessel allowed to stir at 65 ° C. for 20 hours. The resulting mixture was precipitated into 1000 ml of 2-propanol, then filtered to give a white powder product. The product was dissolved in ethyl acetate and reprecipitated to hexane. The solid ethyl 2-(3-butenyl)-3,3-(ethylenedioxy)butanoic acid and styrene copolymer was dried in the air to give 1.0 g. Yield is 13%.

The invention has been described with respect to preferred embodiments. However, as those skilled in the art will recognize, modifications and variations in the specific details which have been described and illustrated may be resorted to without departing from the spirit and scope of the invention as defined in the appended claims.

What is claimed is:

1. A polymer composition particularly suitable for use as a photoresist, comprising the structure:

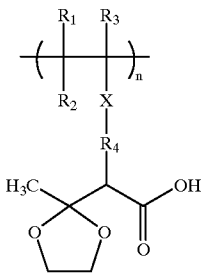

where R$_1$–R$_4$ are independently H, (C$_1$–C$_5$) alkyl or (C$_1$–C$_5$) alkoxy, X is C=O, OCO, CONH, O or aryl (C$_1$–C$_5$) alkyl.

2. The polymer composition as claimed in claim 1 further including a photoacid generator so as to form a photoresist.

3. A photoresist composition, comprising a) a polymer wherein the polymer comprises:

a polymer backbone;

an acetal protected β-keto acid group;

a linkage group connecting the backbone and the acetal protected β-keto acid group;

and b) a photoactive agent capable of causing deprotection of the acetal group.

4. The photoresist as claimed in claim 3 wherein the photoactive agent comprises a photoacid generator.

5. The photoresist as claimed in claim 3 wherein the acetal protected β-keto acid group comprises a 2-substituted 3,3-ethylenedioxy-butanoic acid.

6. The photoresist as claimed in claim 3 wherein the linkage group comprises at least one of an ester group, a phenyl group, an alkyl group and an alkoxy group.

* * * * *